US012560265B1

(12) United States Patent
Hsu et al.

(10) Patent No.: US 12,560,265 B1
(45) Date of Patent: Feb. 24, 2026

(54) PRESSURE RELIEF STRUCTURE FOR FLOATING JOINT

(71) Applicant: FOSITEK CORPORATION, New Taipei (TW)

(72) Inventors: An-Szu Hsu, New Taipei (TW); Chun-Han Lin, New Taipei (TW); Yung-Chih Tseng, New Taipei (TW); Dai-Rong Li, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 19/050,318

(22) Filed: Feb. 11, 2025

(30) Foreign Application Priority Data

Jan. 10, 2025 (TW) ................................. 114101170

(51) Int. Cl.
  *F16L 37/50* (2006.01)
  *F16L 37/22* (2006.01)
  *H05K 7/20* (2006.01)
(52) U.S. Cl.
  CPC ................ *F16L 37/22* (2013.01); *H05K 7/20* (2013.01)
(58) Field of Classification Search
  CPC .. H05K 7/20; F16L 37/22; F16L 37/50; F16L 27/00; F16L 27/08
  See application file for complete search history.

(56) References Cited

U.S. PATENT DOCUMENTS

2023/0184363 A1* 6/2023 Marquis .................. F16L 37/30
                                                            285/261
2024/0077160 A1* 3/2024 Zhang ..................... F16L 37/56

* cited by examiner

*Primary Examiner* — Aaron M Dunwoody
(74) *Attorney, Agent, or Firm* — Demian K. Jackson; Jackson IPG PLLC

(57) ABSTRACT

A pressure relief structure for floating joint includes a hollow fixed retainer having an open and a holed closed side; an adapter joint having a first section partially received in the fixed retainer and a second section extended through the open side to the closed side of the fixed retainer; a first slidable member fitted around the second section and radially slidably attached to an inner wall surface of the closed side; a spring fitted around the second section to pressed against the first slidable member and a shoulder portion formed between the first and second sections; a retaining ring fixedly fitted between the second section and the first slidable member; and a second slidable member connected to the second section and radially slidably attached to an outer wall surface of the closed side. The above structure allows radially deviated pipes to connect end to end with reduced contact friction.

5 Claims, 9 Drawing Sheets

PRESSURE RELIEF STRUCTURE FOR FLOATING JOINT

This application claims the priority benefit of Taiwan patent application number 114101170 filed on Jan. 10, 2025, the disclosure of which is hereby incorporated by reference in its entirety.

FIELD OF THE INVENTION

The present invention relates to a joint pressure relief structure, and more particularly, to a pressure relief structure for a floating joint.

BACKGROUND OF THE INVENTION

A server rack is an important basic structure in datacenters nowadays. The server rack usually has a large number of high-performance servers arranged therein. Following the constantly upgraded computing ability and increased component density of the servers, they produce more and more heat during operation thereof. Under this situation, insufficient heat dissipation performance would have direct influences on the stability and service life of the servers. Air cooling plays a major role in the conventional server heat dissipation. However, the heat dissipation efficiency of the air cooling can no longer satisfy the heat dissipation required by the servers with upgraded operational performance, particularly for the server racks with high density of servers. Since the servers are closely arranged in the server racks with a relatively narrow space left between them, air in the server racks is prevented from flowing to result in worse heat accumulation and deteriorated operational performance. To overcome the limitation of air cooling, liquid or water cooling has been gradually adopted to replace air cooling for dissipating heat produced by servers. Since the precision electronic components in the servers require for highly reliable water cooling system, any water leaking would cause serious damages to the electronic components. It is therefore necessary to set even stricter requirements for the water tightness of the water cooling pipe system.

The existing water cooling servers are usually equipped with quick connect couplers, so that cooling pipes at a movable side (i.e. the server side) and a fixed side (i.e. the server rack side) can be conveniently connected or disconnected to or from each other. While the quick connect couplers allow for flexible and quick demounting and maintenance of the servers, the couplers, which include a male and a female coupler member, might not be easily aligned with each other in the process of connection due to radial deviation or tolerance in size or position, which would have a reverse influence on the leakage tightness of the joints between the male and female couplers. To solve the problem of radial deviation in position, some server rack designs include guide posts provided on the fixed side (i.e. the server rack) and guide blocks provided on the movable side (i.e. the server). The guide posts can be correspondingly inserted into guide holes provided on the guide blocks to achieve accurate connection of the male and female couplers. There are also other designs that employ a floating joint structure, which is radially slidable relative to a fixed retainer to thereby correct the radial deviation between the male and female couplers and ensure good water-tight and operationally convenient connection of the quick connect couplers.

FIGS. 1A to 1E illustrate a prior art floating joint with pressure relief structure 1, which includes an adapter joint 11 radially movable relative to a fixed retainer 10 to overcome the problem of misalignment between the male and female couplers due to any radial deviation or tolerance between them. However, the conventional floating joint with pressure relief structure 1 has the following disadvantages:

(1) it Requires a Relatively Large Radial Space for Use

As shown in FIG. 1A, the conventional floating joint with pressure relief structure 1 includes a slidable washer 12 that is extended through a diametrically smaller hole 16 on the fixed retainer 10. This structure requires a relatively large radial space to significantly limit the flexibility in designing the floating joint with pressure relief structure 1, preventing the same from achieving good effect, particularly when it is used in a space having an insufficient radial size.

(2) There is a Relatively Large Frictional Force Between the Slidable Washer and an Inner Wall Surface of the Fixed Retainer when the Former Slides Radially As shown in FIGS. 1A and 1B, the conventional floating joint with pressure relief structure 1 includes a spring 13 fitted on around the adapter joint 11 with a left end of the spring 13 pressed against a shoulder portion of the adapter joint 11. When the spring 13 is compressed, it produces an elastic restoring force that is leftward applied to the shoulder portion of the adapter joint 11. Meanwhile, the spring 13 has a right end pressed against an inner side surface of a flange portion of the slidable washer 12 and accordingly, applies a rightward force to the slidable washer 12. When the adapter joint 11 is not skewed relative to the fixed retainer 10, a part of the rightward force is transmitted from the right end of the spring 13 to the slidable washer 12 and finally transmitted to the adapter joint 11 via an abutting washer 15 and a retaining ring 14 attached to an outer wall surface of a closed side 102 of the fixed retainer 10. Meanwhile, the other part of the elastic restoring force is transmitted from the right end of the spring 13 to the slidable washer 12 and then further transmitted from the slidable washer 12 to an inner wall surface of the closed side 102 of the fixed retainer 10. With these arrangements, a relatively large frictional force is produced when the slidable washer 12 slides radially on and relative to the inner wall surface of the closed side 102 of the fixed retainer 10. The large frictional force would affect the sliding ability of the slidable washer 12 and cause quick component wear and tear to reduce the structural robustness of the floating joint.

(3) Insufficient Stability of the Retaining Ring Fitted on the Adapter Joint at an Outer Side of the Fixed Retainer As shown in FIG. 1C, when the adapter joint 11 partially received in the fixed retainer 10 is deviated or skewed in position, it has a centerline A' not located on the same line as a centerline A of the fixed retainer 10. For example, in the case the adapter joint 11 is skewed upward, its centerline A' would upward deviate from the centerline A of the fixed retainer 10. This condition will significantly affect the stability of the retaining ring 14.

Further, as shown in FIG. 1D, when the left end of the spring 13 is pressed against the shoulder portion of the adapter joint 11, the elastic restoring force of the spring 13 is transmitted from the right end of the spring 13 to the slidable washer 12 and the fixed retainer 10. The force is then transmitted from the fixed retainer 10 to the abutting washer 15 via an elastic element 17 fitted between the fixed retainer 10 and the abutting washer 15. Meanwhile, as shown in FIG. 1E, the elastic restoring force of the spring 13 is finally transmitted from the abutting washer 15 to the retaining ring 14. Since the retaining ring 14 has only one side that is subjected to the force and does not have any external structure for supporting it, the force passing through a hole of the retaining ring 14 might be unevenly applied to the retaining ring 14 to cause failure or loosening of the retain ring 14 from the adapter joint 11. This condition would no doubt have an adverse influence on the overall structural stability of the conventional floating joint 1.

(4) Having a Weak Point in the Force Transmission Mechanism

Please refer to FIGS. 1C to 1E again. The retaining ring 14 serves as a key element for supporting the structure of the floating joint 1 and its stability is easily subjected to various influences, such as the direction of an external force applied thereto and positional deviation of the structure. Therefore, the retaining ring 14 forms a weak point in the force transmission across the existing floating joint 1 and will lead to reduced overall structural stability and reliability of the existing floating joint 1.

It is therefore desirable to solve the technical problems in the existing floating joint 1 designed for water cooling servers.

SUMMARY OF THE INVENTION

To effectively solve the above technical problems, a primary object of the present invention is to provide a pressure relief structure for floating joint, which includes a fixed retainer and an adapter joint axially received in and radially movable relative to the fixed retainer. When the floating joint is connected to a female coupler member end to end and the adapter joint thereof is radially moved, the pressure relief structure for the adapter joint can effectively reduce a radially frictional force between the adapter joint and the fixed retainer to help in stable and smooth moving of the adapter joint with reduced wear and tear. The pressure relief structure for floating joint also includes a first slidable member, which has a first cylindrical portion and a first flange portion. The first cylindrical portion is fitted around an outer surface of the adapter joint and the first flange portion is attached to an inner wall surface of the fixed retainer without being extended through a diametrically smaller hole on the fixed retainer or requiring for a large radial space to thereby give the pressure relief structure with increased adaptability to structure. Further, a retaining ring is provided in the fixed retainer and located between the adapter joint and the first slidable member, such that the retaining ring can keep providing stable holding function without becoming loosened or failed even when the adapter joint is skewed.

To achieve the above and other objects, the pressure relief structure for floating joint according to an embodiment includes a fixed retainer, an adapter joint, a first slidable member, a spring, a retaining ring, and a second slidable member. The fixed retainer has an open side and a closed side and internally defines a receiving space that is located between the open side and the closed side; and the closed side is provided with a through hole. The adapter joint includes a first section and a second section. The first section has at least a portion received in the receiving space of the fixed retainer closer to the open side; and the second section is extended through the open side into the fixed retainer and then extended to the through hole of the fixed retainer. The adapter joint has a radially expanded shoulder portion formed between the first section and the second section. The first slidable member includes a first cylindrical portion and a first flange portion radially extended from an end of the first cylindrical portion. The first cylindrical portion is extended toward the open side of the fixed retainer to be fitted on around an outer surface of the second section of the adapter joint. The first flange portion includes a first surface and an opposite second surface, and the first surface of the first flange portion is radially slidably attached to an inner wall surface of the closed side of the fixed retainer. The spring is fitted around the outer surface of the second section of the adapter joint and has an end pressed against the shoulder portion of the adapter joint and another end pressed against the second surface of the first flange portion of the first slidable member. The retaining ring is fixedly fitted on around the outer surface of the second section of the adapter joint to engage with an inner surface of the first cylindrical portion of the first slidable member. The second slidable member is fitted on around the second section of the adapter joint and radially slidably attached to an outer wall surface of the closed side of the fixed retainer.

A pressure relief structure for floating joint according to another embodiment includes a fixed retainer, an adapter joint, a first slidable member, a spring, a retaining ring, a second slidable member, and a fastening element. The fixed retainer has an open side and a closed side and internally defines a receiving space that is located between the open side and the closed side; and the closed side is provided with a through hole. The adapter joint includes a first section and a second section. The first section has at least a portion received in the receiving space of the fixed retainer closer to the open side; and the second section is extended through the open side into the fixed retainer and then extended to an outer side of the through hole of the fixed retainer. The adapter joint has a radially expanded shoulder portion formed between the first section and the second section. The first slidable member includes a first cylindrical portion and a first flange portion radially extended from an end of the first cylindrical portion. The first cylindrical portion is extended toward the open side of the fixed retainer to be fitted on around an outer surface of the second section of the adapter joint. The first flange portion includes a first surface and an opposite second surface, and the first surface of the first flange portion is radially slidably attached to an inner wall surface of the closed side of the fixed retainer. The spring is fitted around the outer surface of the second section of the adapter joint and has an end pressed against the shoulder portion of the adapter joint and another end pressed against the second surface of the first flange portion of the first slidable member. The retaining ring is fixedly fitted on around the outer surface of the second section of the adapter joint to engage with an inner surface of the first cylindrical portion of the first slidable member. The second slidable member is fitted on around the second section of the adapter joint and radially slidably attached to an outer wall surface of the closed side of the fixed retainer. The fastening element is fixedly fitted on around the second section of the adapter joint and in contact with the second slidable member.

According to the technical solution of the present invention, when the adapter joint with the above described pressure relief structure is connected to a female coupler member end to end, the retaining ring can support the first slidable member to reduce a radially frictional force between the first slidable member and the fixed retainer. Therefore, the first slidable member can radially sliding stably and smoothly to reduce wear and tear thereof. Meanwhile, since the first cylindrical portion of the first slidable member is extended toward the open side of the fixed retainer and fitted on around the outer surface of the second section of the adapter joint with the first flange portion being attached to the inner wall surface of the fixed retainer, the first slidable member is not necessarily to extend through the diametrically smaller through hole on the fixed retainer and accordingly, does not require for a large radial space while has upgraded adaptability to structure. Further, since the retaining ring is located in the fixed retainer and stably fitted between the adapter joint and the first slidable member, the retaining ring can remain in complete function with out becoming loosened and failed, even when the adapter joint is in a skewed position. Also, in another embodiment of the present invention, the adapter joint and the second slidable member can be integrally formed as a single element, which not only simplifies the manufacturing and assembling procedure of the present invention, but also provides the present invention with upgraded stability and reliability in structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof.

Figure 1A:
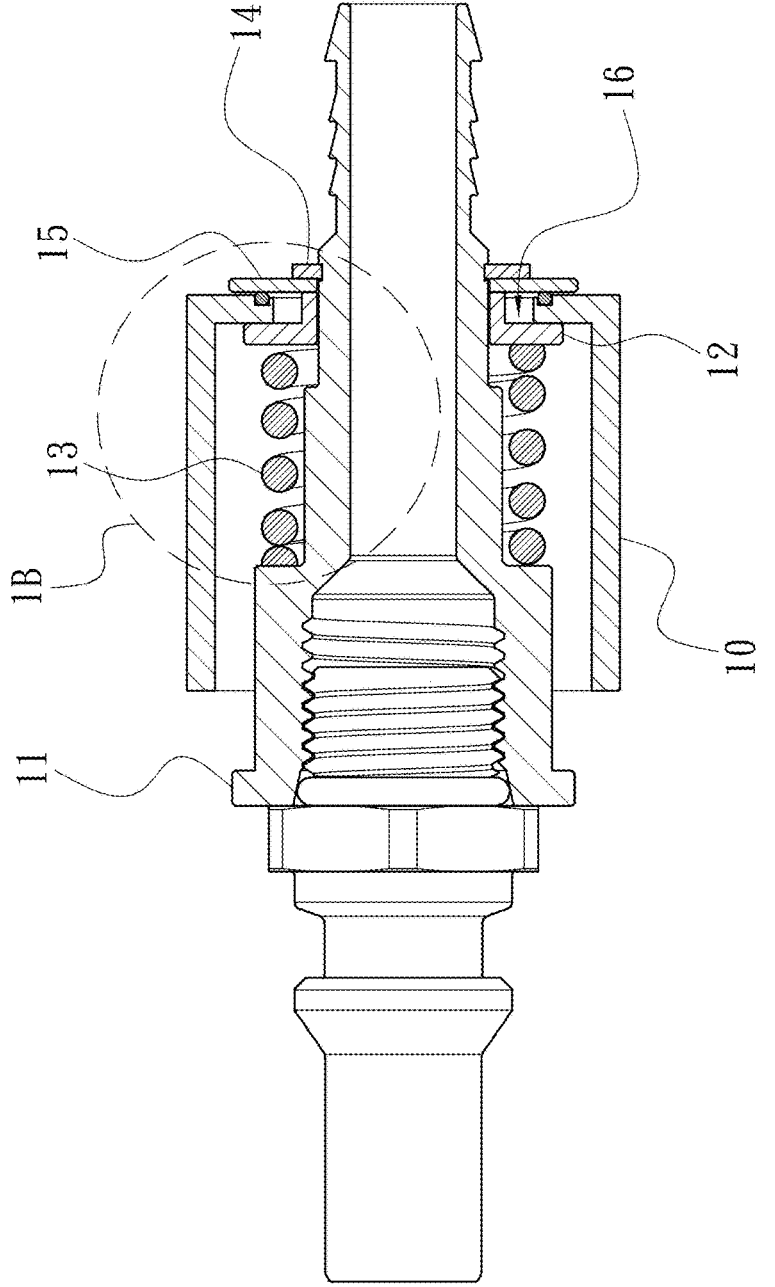
FIG. 1A is a sectional side view of a conventional floating joint with pressure relief structure.
Figure 1B:
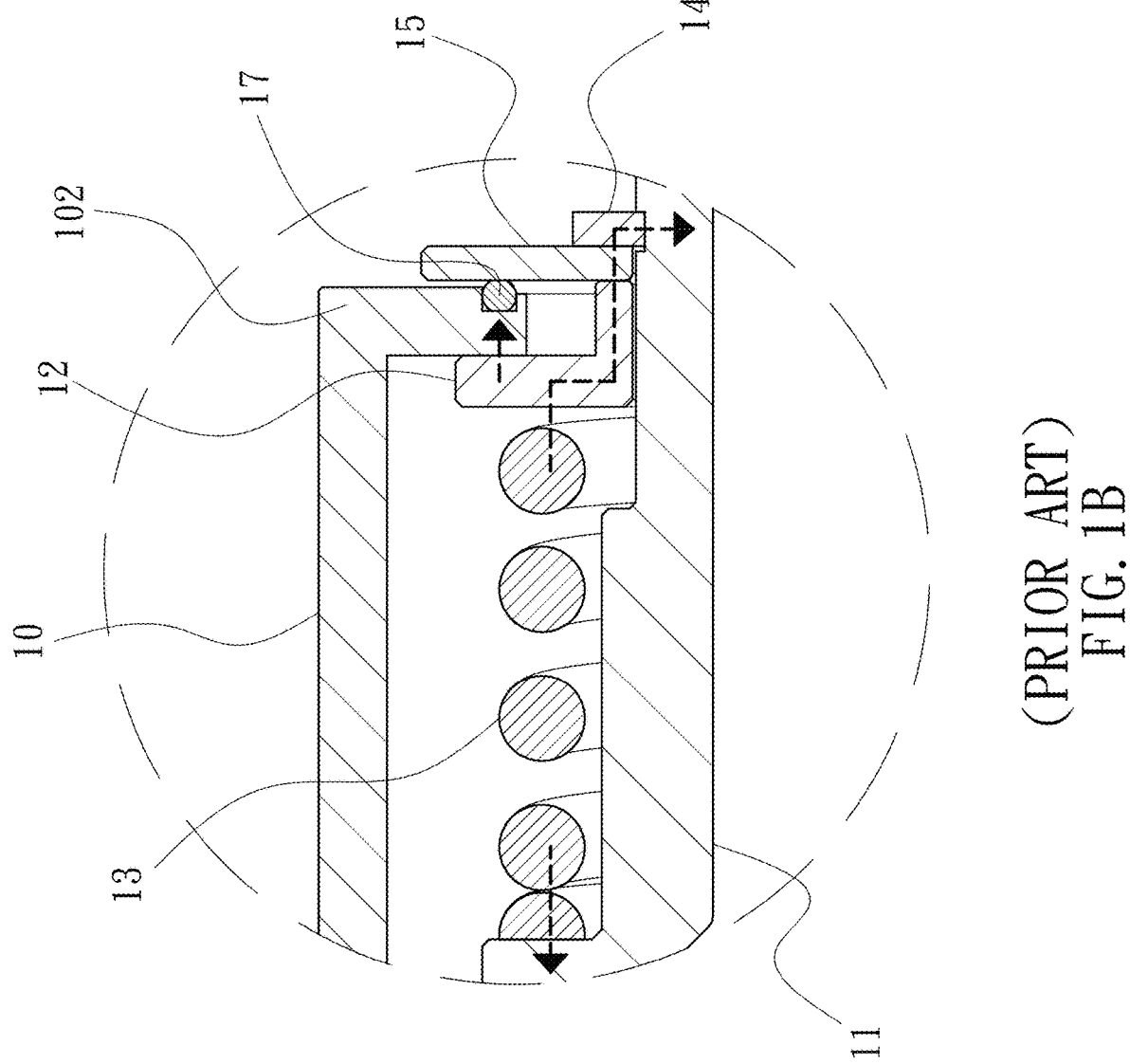
FIG. 1B shows force transmission paths in the conventional floating joint with pressure relief structure of FIG. 1A when an adapter joint thereof is not skewed.
Figure 1C:
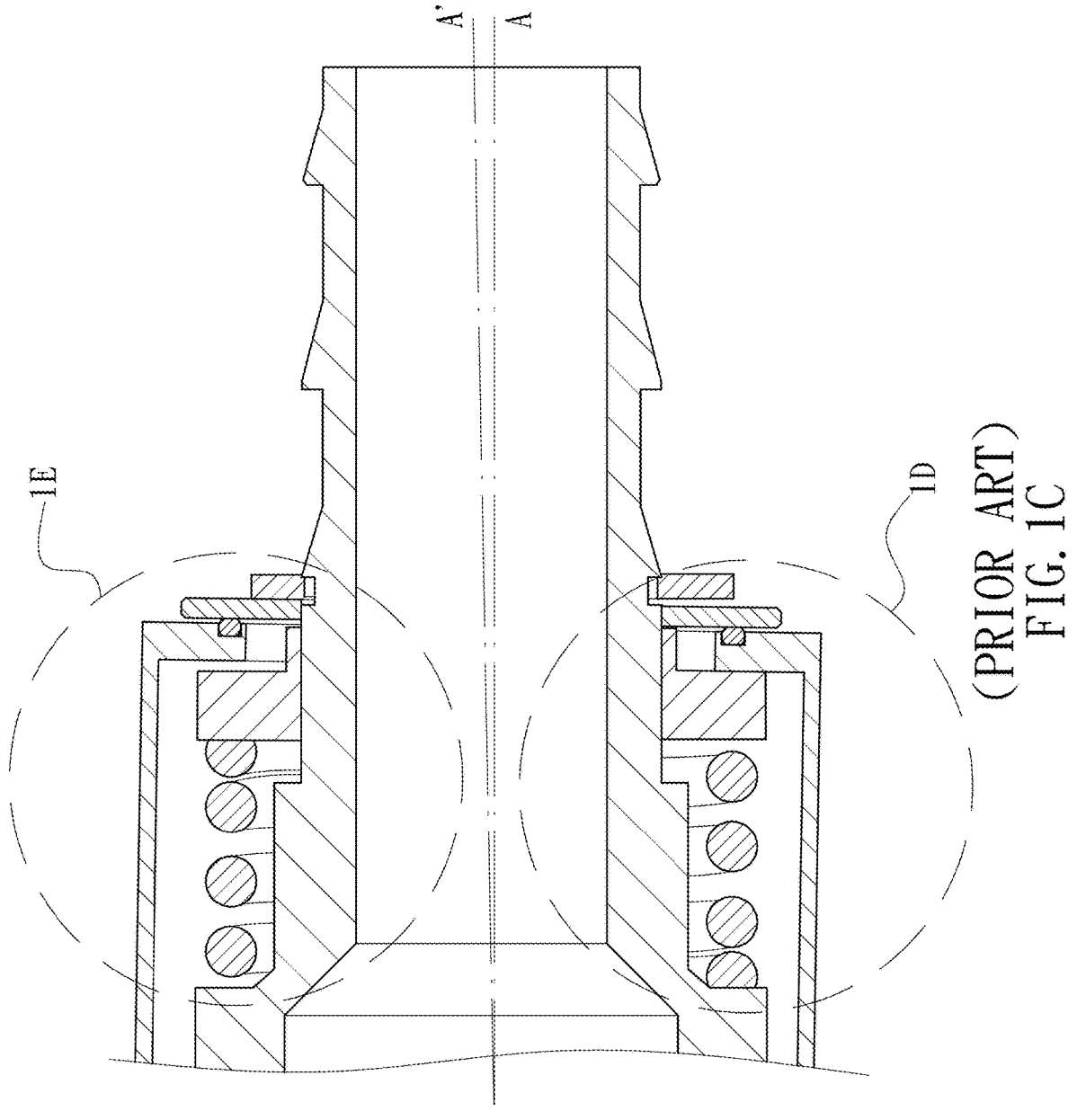
FIG. 1C shows the adapter joint is skewed relative to a fixed retainer in the conventional floating joint with pressure relief structure of FIG. 1A.
Figure 1E:
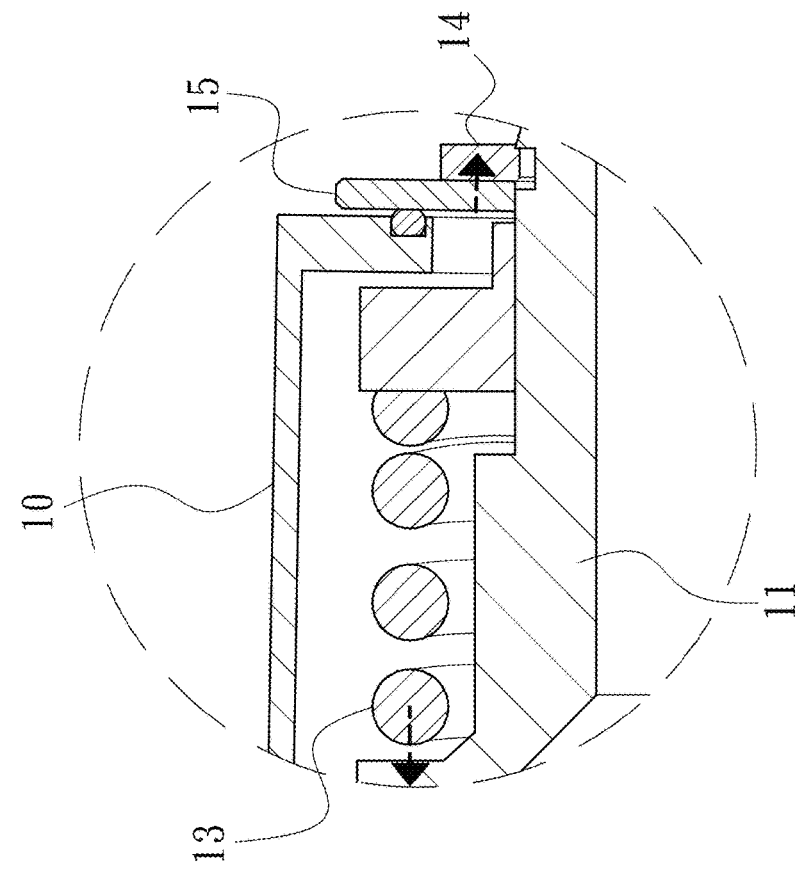
FIG. 1E shows the force transmission paths through components that are located at an upper part of the conventional floating joint with pressure relief structure of FIG. 1C.
Figure 1D:
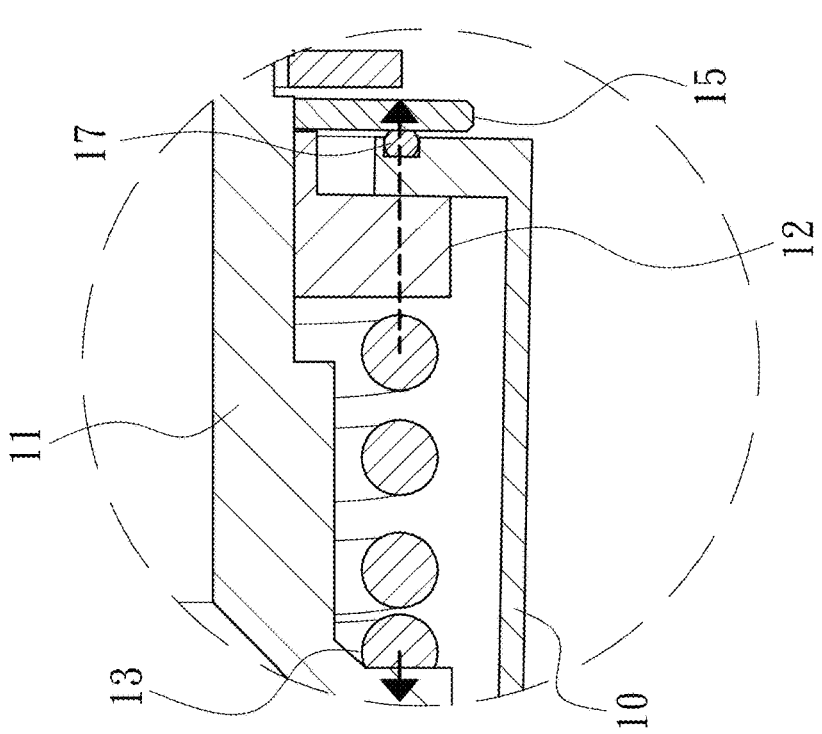
FIG. 1D shows the force transmission paths through components that are located at a lower part of the conventional floating joint with pressure relief structure of FIG. 1C.
Figure 2A:
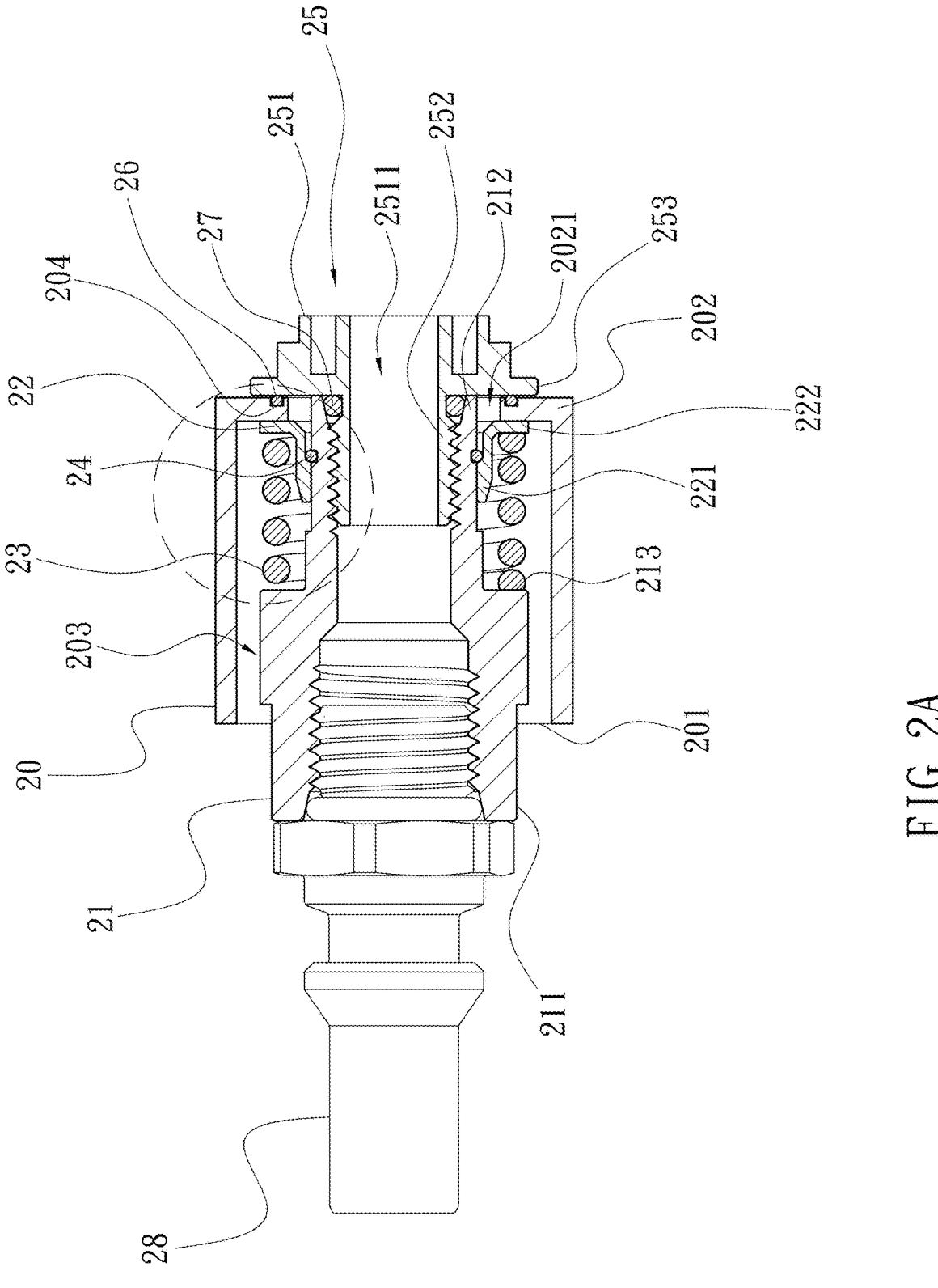
FIG. 2A is an assembled sectional side view of a pressure relief structure for floating joint according to the present invention.
Figure 2B:
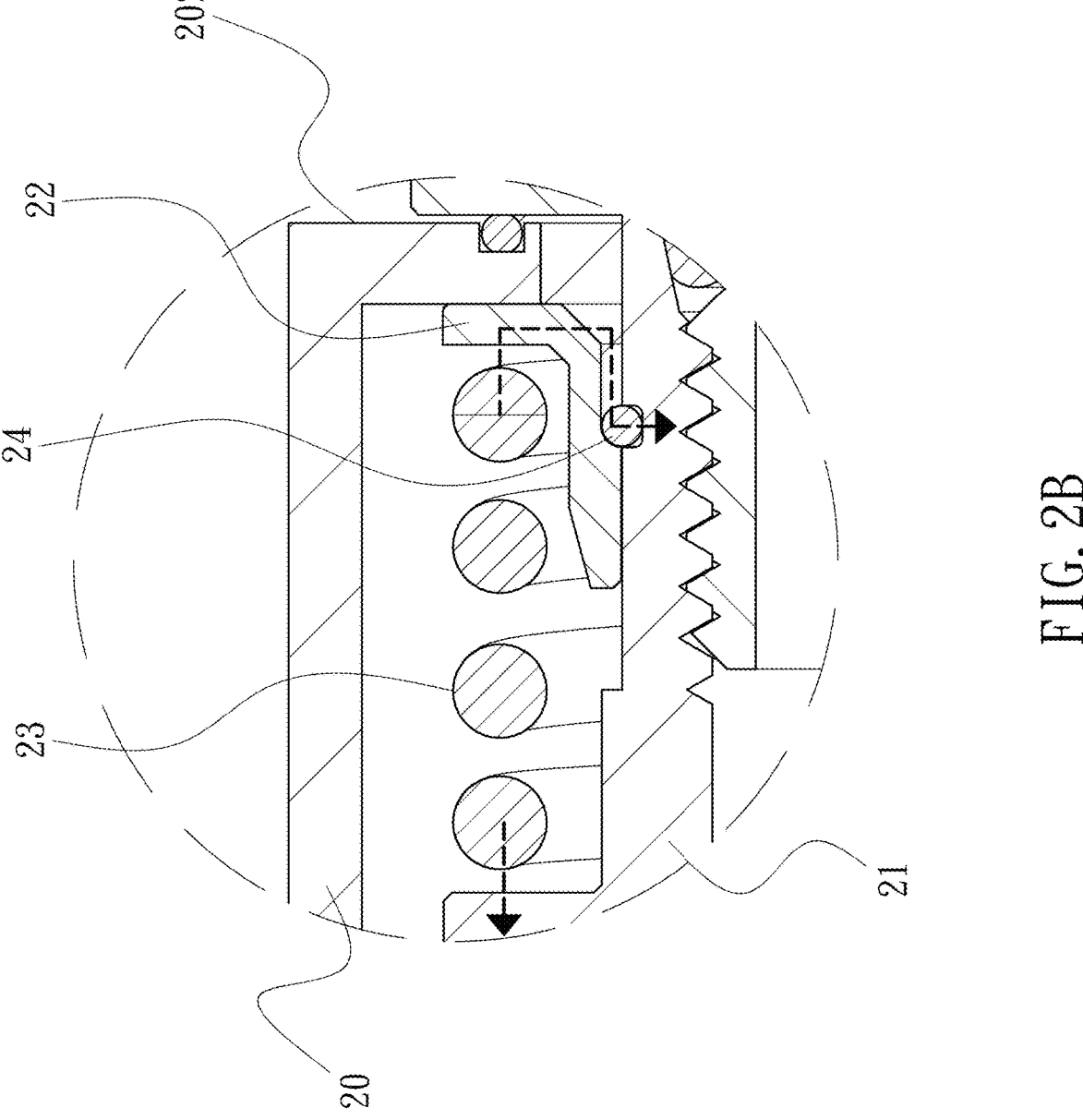
FIG. 2B shows the force transmission paths in the pressure relief structure for floating joint according to the present invention when the pressure relief structure is subjected to pressure.
Figure 3:
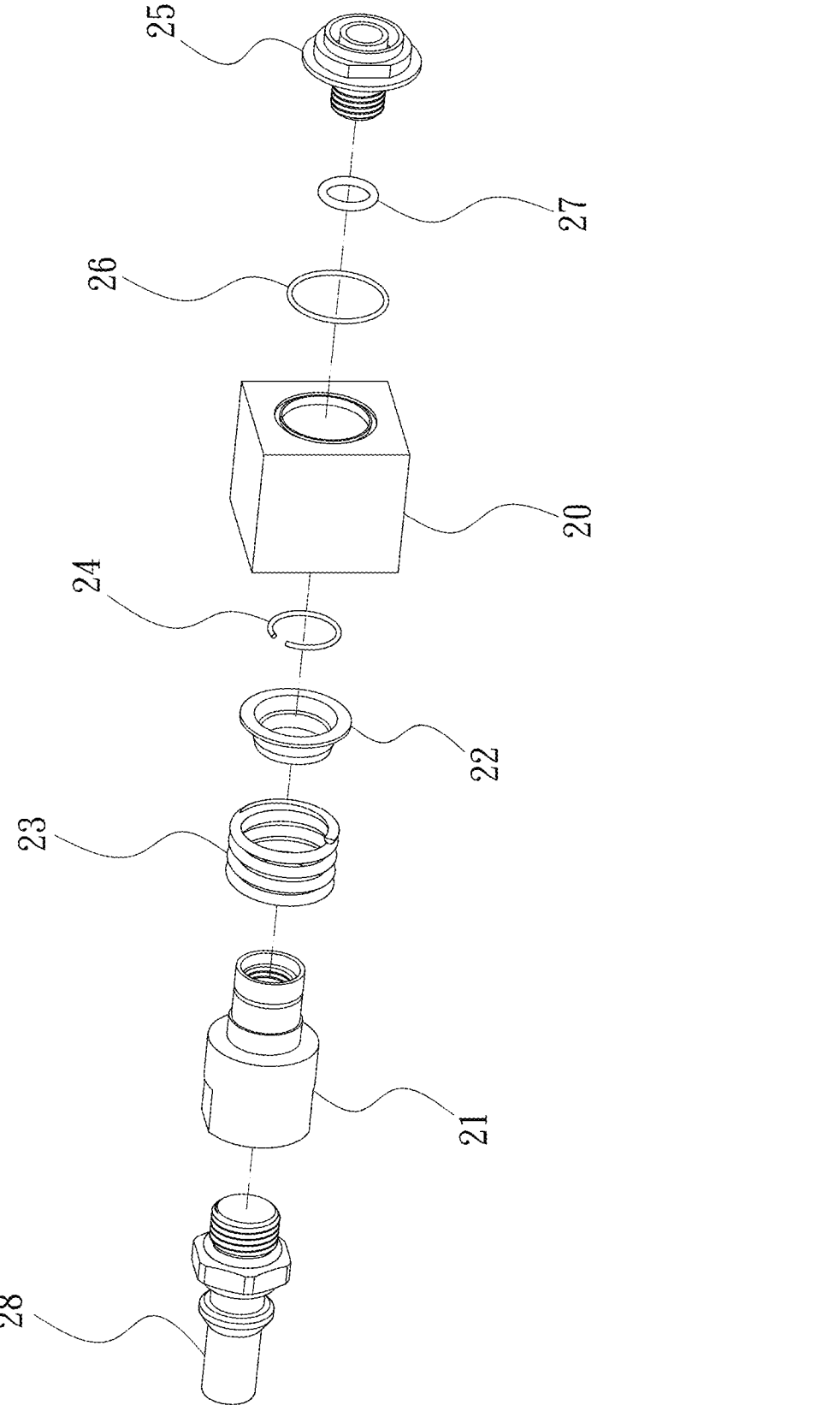
FIG. 3 is an exploded perspective view of the pressure relief structure for floating joint according to the present invention.
Figure 4:
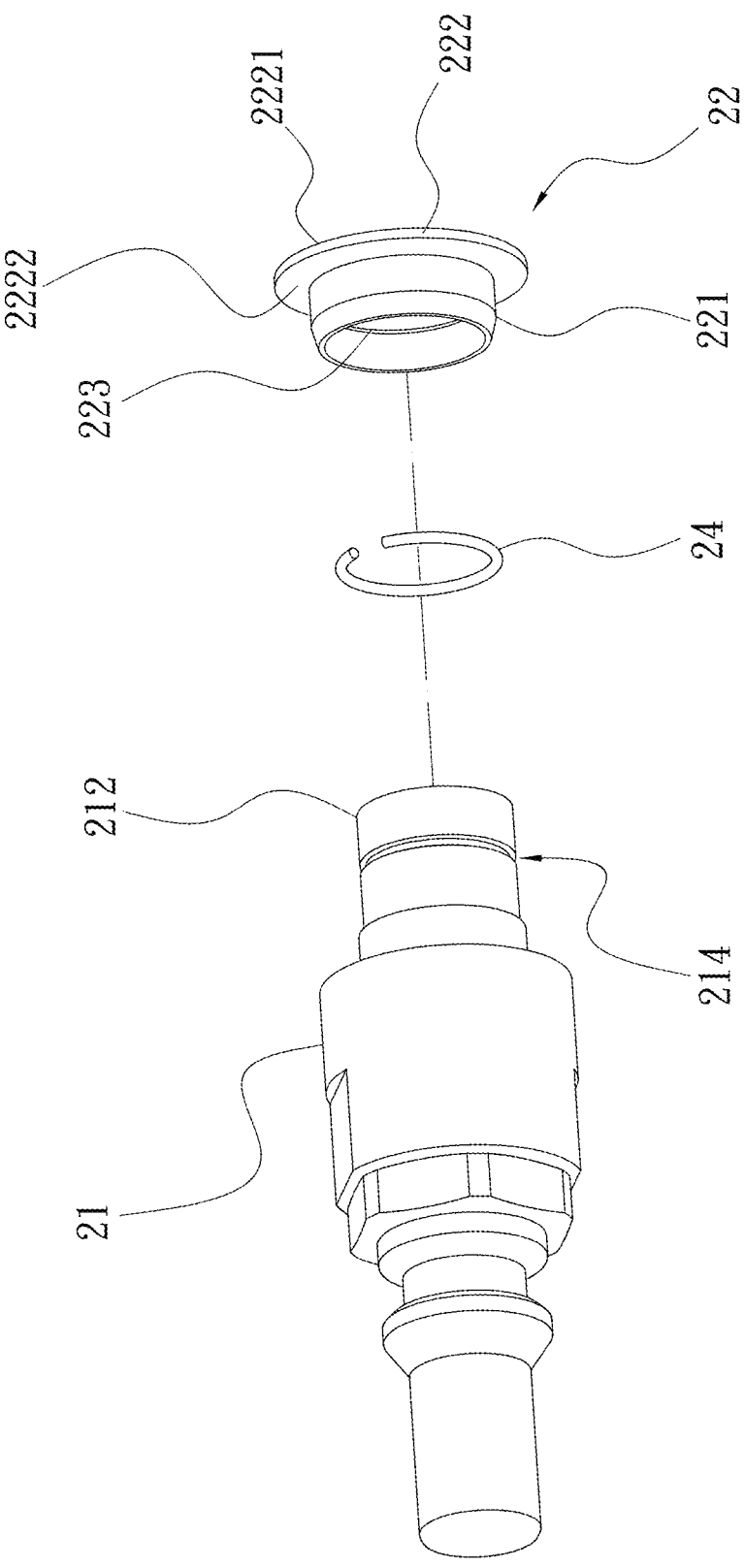
FIG. 4 is an exploded perspective view showing an adapter joint, a first slidable member, and a retaining ring included in the pressure relief structure for floating joint according to the present invention.

Please refer to FIG. 2A, which is an assembled sectional side view of a pressure relief structure for floating joint according to the present invention; to FIG. 2B, which shows force transmission paths in the pressure relief structure for floating joint of FIG. 2A, to FIG. 3, which is an exploded perspective view of the pressure relief structure for floating joint of FIG. 2A, and to FIG. 4, which is an exploded perspective view showing an adapter joint 21, a first slidable member 22, and a retaining ring 24 included in the pressure relief structure for floating joint according to the present invention. For the purpose of conciseness and clarity, the present invention is also briefly referred to as the pressure relief structure herein.

As shown in FIGS. 2A and 3, the pressure relief structure according to the present invention is generally denoted by reference numeral 2 and includes a fixed retained 20, an adapter joint 21, a first slidable member 22, a spring 23, a retaining ring 24, and a second slidable member 25.

The fixed retainer 20 has an open side 201 and a closed side 202 and internally defines a receiving space 203, which is located between the open side 201 and the closed side 202 for accommodating related components therein. The closed side 202 of the fixed retainer 20 is provided with a through hole 2021. In the embodiment, the fixed retainer 20 has an overall configuration as a hollow cubic structure. The through hole 2021 may be round or other geometrical shapes to facilitate connection with a round pipe or other part having a geometric cross section corresponding to that of the through hole 2021.

The adapter joint 21 includes a first section 211 and a second section 212. The first section 211 has at least a portion received in the receiving space 203 of the fixed retainer 20 closer to the open side 201. The second section 212 is extended through the open side 201 into the fixed retainer 20 and then extended to the through hole 2021 of the fixed retainer 20. Alternatively, the second section 212 is extended through the open side 201 of the fixed retainer 20 to an outer side of the through hole 2021. In the embodiment, the adapter joint 21 is a hollow cylindrical structure, and the first section 211 has an outer diameter larger than that of the second section 212, so that a shoulder portion 213 is formed between the first section 211 and the second section 212. The adapter joint 21 internally defines a passage axially extending through the whole adapter joint 21 for delivering a fluid. The first section 211 of the adapter joint 21 is provided on at least one of an inner and an external surface thereof with a threaded structure. In the illustrated embodiment, the threaded structure is provided on around the inner surface of the first section 211 for connecting with, for example, a quick coupler 28, which can be quickly assembled or removed to or from the adapter joint 21. The second section 212 of the adapter joint 21 is provided on around an inner surface with a female threaded structure for engaging with a second slidable member (or adapter) 25.

As shown in FIGS. 2A, 3, and 4, the first slidable member 22 includes a first cylindrical portion 221 and a first flange portion 222 radially extended from an end of the first cylindrical portion 221. The first cylindrical portion 221 is a hollow cylindrical structure extended from the first flange portion 222 toward the open side 201 of the fixed retainer 20 to be fitted on around an outer surface of the second section 212 of the adapter joint 21. The first flange portion 222 includes a first surface 2221 and an opposite second surface 2222 (see FIG. 4). The first surface 2221 of the first flange portion 222 is a flat contact surface that is in contact with and radially slidably attached to an inner wall surface of the closed side 202 of the fixed retainer 20. With these arrangements, the first slidable member 22 is radially slidable to adapt to a necessary displacement when connecting two pipes end to end. Meanwhile, since the first flange portion 222 is in contact with the inner wall surface of the closed side 202 of the fixed retainer 20, the first sliding member 22 has an effectively increased sliding contact area, which can disperse pressure applied to the contact area to avoid quick wear and tear of components of the pressure relief structure 2 possibly caused by operation over a long time.

The spring 23 is fitted on around an outer surface of the second section 212 of the adapter joint 21 to extend axially. The spring 23 has an end pressed against the shoulder portion 213, which provides the spring 23 with a stable supporting base point. Another end of the spring 23 is pressed against the second surface 2222 of the first flange portion 222 of the first slidable member 22 to ensure that a force acted on the spring 23 can be evenly transmitted to other related components. Since the spring 23 can provide a stable normal force, the adapter joint 21 can always quickly return to and stay at a predetermined fixed position after it is radially moved and avoid structural deviation thereof. Meanwhile, since the spring 23 has an axially elastically compressible distance, it is adaptable to a dimensional tolerance in the axial direction, allowing the adapter joint 21 to withstand a certain degree of error in size. Further, the spring 23 is flexible, such that it can support some minor adjustment in skew of the adapter joint 21 to give the whole pressure relief structure of the present invention a further upgraded dynamic adaptation and operational stability.

The retaining ring 24 is fixedly fitted on around the outer surface of the second section 212 of the adapter joint 21 to tightly engage with an inner surface of the first cylindrical portion 221 of the first slidable member 22. The retaining ring 24 has a rectangular cross-sectional shape or a round cross-sectional shape. Specifically, as shown in FIG. 4, in the embodiment, the retaining ring 24 has a part being set in a first annular groove 214 formed on around the outer surface of the second section 212 of the adapter joint 21, while another part of the retaining ring 24 is set in a second annular groove 223 formed on around the inner surface of the first cylindrical portion 221 of, so that the first slidable member 22 is firmly connected to and precisely located on the second section 212 of the adapter joint 21. Further, when the quick coupler 28 is in a non-axial movement, the retaining ring 24 provides a supporting force directionally opposite to an elastic restoring force of the compressed spring to effectively balance a push exerted by the spring 23 to the first slidable member 22, such that a frictional force between the fixed retainer 20 and the first slidable member 22 is reduced. With this arrangement, the first slidable member 22 can have upgraded sliding ability and operational stability while other related components can have prolonged service life.

The second slidable member 25 is fitted on around the second section 212 of the adapter joint 21 to be radially slidably attached to an outer wall surface of the closed side 202 of the fixed retainer 20. Specifically, the second slidable member 25 includes a base portion 251 and a second cylindrical portion 252. The base portion 251 internally defines a passage 2511 extending through the second slidable member 25 and axially communicating with the second cylindrical portion 252. The second cylindrical portion 252 is axially extended from one side of the base portion 251 to form a hollow cylindrical structure extending through the through hole 2021 of the fixed retainer 20 to connect with the second section 212 of the adapter joint 21. An external pipe (not shown) is communicable with the adapter joint 21 via the second cylindrical portion 252. In the embodiment, the second cylindrical portion 252 is provided on around an outer surface with a male threaded structure for engaging with the female threaded structure provided on the second section 212 of the adapter joint 21. In the embodiment, the base portion 251 of the second slidable member 25 further includes a second flange portion 253 radially outward extended from an outer surface of the base portion 251. The second flange portion 253 has a flat contact surface to be radially slidably attached to the outer wall surface of the closed side 202 of the fixed retainer 20. This type of slidably fitting of the second flange portion 253 with the fixed retainer 20 allows the second slidable member 25 to move radially during a pipe connection and is accordingly, adaptable to any displacement that is required when a radial deviation or a tolerance occurs in the process of pipe connection. Further, the second slidable member 25 also provides the function of an adapter. That is, an adapter is integrated into the second slidable member 25 to form an integral component, which further simplifies the manufacturing and assembling procedures of the present invention. Meanwhile, the second slidable member 25 with integrated adapter also enables optimized overall structural stability and reduces gaps or loosening condition possibly caused by complicated connection between components. Therefore, the pressure relief structure 2 of the present invention has significantly increased reliability.

As shown in FIGS. 2A and 3, the present invention further includes an elastic element 26 and a sealing element 27, which are respectively illustrated as an O-ring. The elastic element 26 is fitted in a third annular groove 204 provided on the outer wall surface of the closed side 202 of the fixed retainer 20 and is in contact with the second flange portion 253 of the second slidable member 25. The elastic element 26 has a main function of providing an amount of interference to produce a normal force. Through the interference of the elastic element 26 with components located adjacent to it, the components can maintain structural stability and receive balanced force application in the pipe connection. The sealing element 27 is fitted on around the inner surface of the second section 212 of the adapter joint 21 and is in sealed contact with the second cylindrical portion 252 of the second slidable member 25 to thereby give the pressure relief structure 2 further an upgraded sealing ability.

In the embodiment, the pressure relief structure 2 further includes a quick coupler 28 removably connected to the first section 211 of the adapter joint 21. The quick coupler 28 has an end provided with connection means, such as a thread, a snap-on structure, or a quick connect mechanism, for engaging with the first end 211 of the adapter joint 21 to enable reliable and convenient connection and disconnection of the quick coupler 28 to and from the adapter joint 21, allowing a user to quickly change or adjust the connection according to different requirements in applications.

In the present invention, the retaining ring 24 supports the first slidable member 22 and provides the first slidable member 22 with a support force directionally opposite to the spring elastic restoring force when the adapter joint 21 is in a non-axial movement, so as to reduce the frictional force between the fixed retainer 20 and the first slidable member 22 and enable the first slidable member 22 to slide stably with reduced wear and tear. The first cylindrical portion 221 is extended toward the open side 201 of the fixed retainer 20 and fitted on around the outer surface of the second section 212 of the adapter joint 21, while the first flange portion 222 is attached to the inner wall surface of the fixed retainer 20 without extending through the relatively small through hole 2021 on the fixed retainer 20. Therefore, the first slidable member 22 does not require large space in the radial direction and has upgraded structural adaptation. In addition, in the present invention, since the retaining ring 24 is stably held between the adapter joint 21 and the first slidable member 22 instead of being located at an outer side of the fixed retainer as the conventional technical skill, it can always provide complete function with out becoming loosened or failed even when the adapter joint 21 is skewed. In the present invention, the second slidable member 25 can have an adapter integrally formed with it to simplify the manufacturing and assembling procedures of the present invention and upgrade the structural stability and reliability thereof.

As shown in FIG. 2B, the pressure relief structure 2 also provides optimized and improved force transmission paths when it is subjected to pressure. A force transmitted from the right end of the spring 23 to the first slidable member 22 and then applied to the inner surface of the closed side 202 of the fixed retainer 20 will be transferred by the retaining ring 24 to the adapter joint 21 that is received in the fixed retainer 20. Compared to the prior art pressure relief structure 1, the pressure relief structure 2 being subjected to a force can have a reduced frictional force occurred when the first slidable member 22 radially slides on the inner wall surface of the closed side 202 of the fixed retainer 20. Besides, since the force is eventually transferred via the retaining ring 24 to the adapter joint 21 received in the fixed retainer 20, it is able to effectively avoid the force from being transferred to components located at an outer side of the closed side 202 of the fixed retainer 20. This improvement not only reduces the frictional force occurred when the first slidable member 22 slides on the inner wall surface of the closed side 202 of the fixed retainer 20, but also eliminates the problem of loosened or failed outer components under the force to thereby significantly upgrade the structural stability and reliability of the present invention.

Figure 5A:
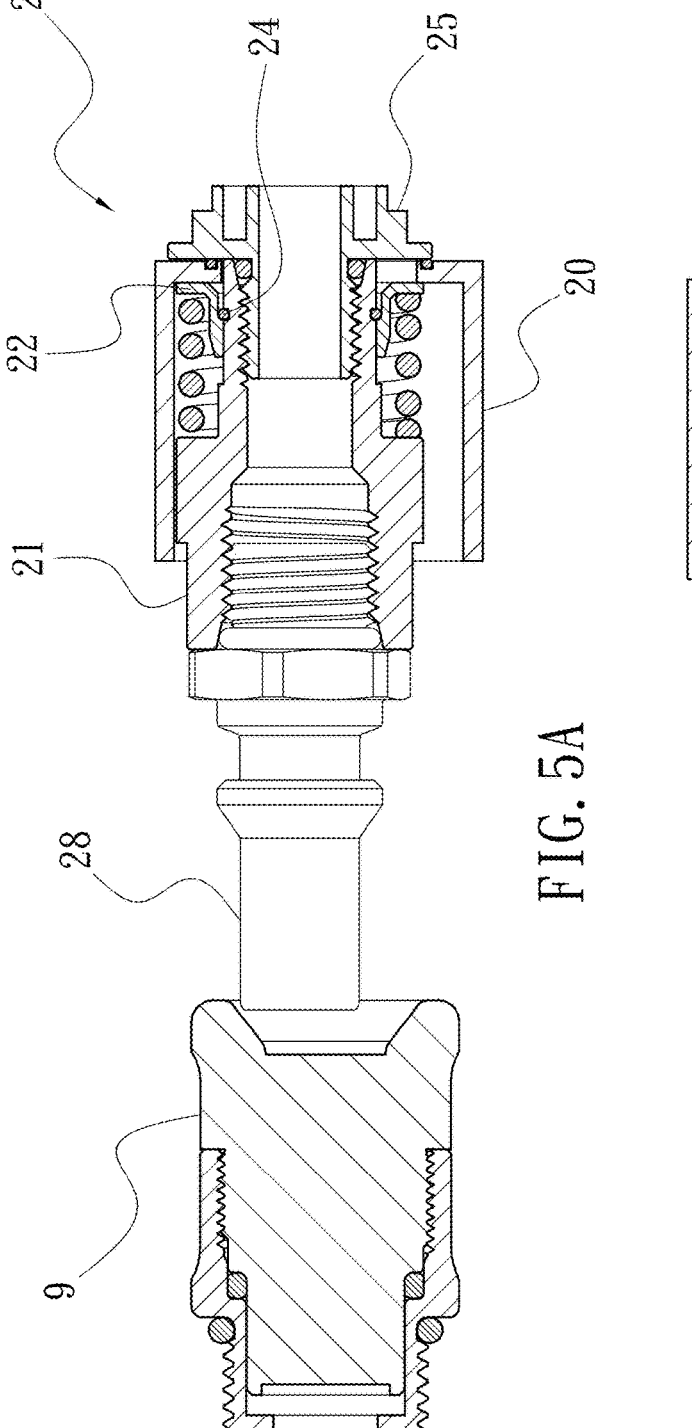
FIG. 5 shows the manner in which the pressure relief structure for floating joint according to the present invention works.
Figure 5B:
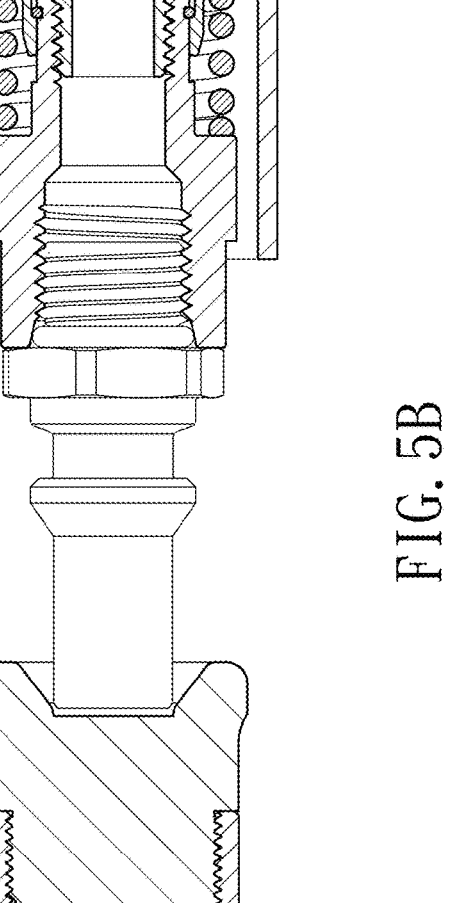

Please refer to FIG. 5, which shows the manner in which the pressure relief structure 2 according to the present invention works. As shown, the pressure relief structure 2 with the above described internal structure can realize stable and reliable connection of pipes end to end. The pressure relief structure 2 is self-adaptable to radial or axial tolerance in the process of being connected to a female coupler member 9 end to end, allowing the female coupler member 9 to be precisely and tightly connected to the pressure relief structure 2. Meanwhile, the first slidable member 22 and the retaining ring 24 provided in the pressure relief structure 2 have the function of reducing frictional resistance, enhancing sliding smoothness, and avoiding loosened and failed pipe connection. In addition, the second slidable member 25 can function as an adapter at the same time to enable further simplified manufacturing and assembling procedures of the present invention.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A pressure relief structure for floating joint, comprising:
a fixed retainer having an open side and a closed side and internally defining a receiving space that is located between the open side and the closed side; and the closed side being provided with a through hole;
an adapter joint including a first section and a second section; the first section having at least a portion being received in the receiving space of the fixed retainer closer to the open side; the second section being extended through the open side into the fixed retainer and then extended to the through hole of the fixed retainer; and the adapter joint having a shoulder portion formed between the first section and the second section;
a first slidable member including a first cylindrical portion and a first flange portion radially extended from an end of the first cylindrical portion; the first cylindrical portion being extended toward the open side of the fixed retainer to be fitted on around an outer surface of the second section of the adapter joint; the first flange portion including a first surface and an opposite second surface, and the first surface of the first flange portion being radially slidably attached to an inner wall surface of the closed side of the fixed retainer;
a spring being fitted around the outer surface of the second section of the adapter joint; the spring having an end pressed against the shoulder portion of the adapter joint and another end pressed against the second surface of the first flange portion of the first slidable member;
a retaining ring being fixedly fitted on around the outer surface of the second section of the adapter joint to engage with an inner surface of the first cylindrical portion of the first slidable member; and
a second slidable member being fitted on around the second section of the adapter joint and radially slidably attached to an outer wall surface of the closed side of the fixed retainer.

2. The pressure relief structure for floating joint as claimed in claim 1, wherein the second slidable member includes a base portion and a second cylindrical portion axially extended from one side of the base portion; the base portion internally defining a passage extending therethrough and axially communicating with the second cylindrical portion and including a radially outward extended second flange portion; the second cylindrical portion being extended through the through hole on the fixed retainer to connect with the second section of the adapter joint, so that an external pipe is communicable with the adapter joint via the second cylindrical portion; and the second flange portion being radially slidably attached to the outer wall surface of the closed side of the fixed retainer.

3. The pressure relief structure for floating joint as claimed in claim 2, further comprising an elastic element and a sealing element; the elastic element being fitted in a third annular groove provided on the outer wall surface of the closed side of the fixed retainer and being in contact with the second flange portion of the second slidable member; and the sealing element being fitted on around an inner surface of the second section of the adapter joint and in sealed contact with the second cylindrical portion of the second slidable member.

4. The pressure relief structure for floating joint as claimed in claim 1, wherein the retaining ring has a part being set in a first annular grove formed on around the outer surface of the second section of the adapter joint and another part set in a second annular groove formed on around an inner surface of the first cylindrical portion of the first slidable member.

5. The pressure relief structure for floating joint as claimed in claim 1, further comprising a quick coupler, which is removably connected to the first section of the adapter joint.

* * * * *